Sept. 21, 1954 R. N. HALL 2,689,930

SEMICONDUCTOR CURRENT CONTROL DEVICE

Filed Dec. 30, 1952

Inventor:
Robert N. Hall,
by Paul A. Frank
His Attorney.

Patented Sept. 21, 1954

2,689,930

UNITED STATES PATENT OFFICE 2,689,930

SEMICONDUCTOR CURRENT CONTROL DEVICE

Robert N. Hall, Schenectady, N. Y., assignor to General Electric Company, a corporation of New York Application December 30, 1952, Serial No. 328,634

15 Claims. (Cl. 317—234)

Figure 1:
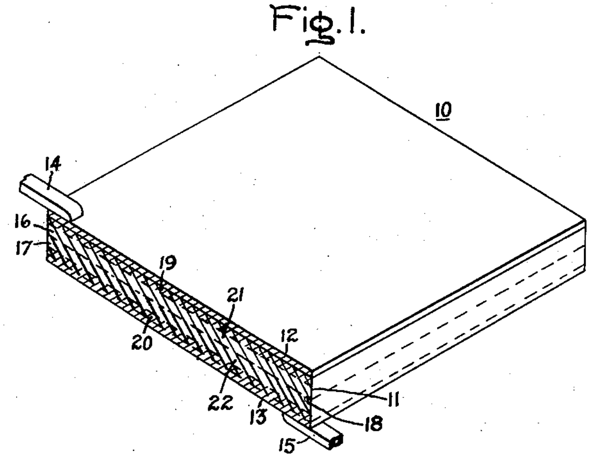

My invention relates to semiconductor devices and more particularly to rectifiers and transistors suitable for high power applications.

Semiconductors such as germanium and silicon have become conventionally classified as positive, P-type, or negative, N-type, depending primarily upon the type and sign of their predominant conduction carriers. The predominant conduction carriers in N-type semiconductors are free electrons, while the predominant conduction carriers in P-type semiconductors are electron vacancies which have become known as "positive holes." The electrical characteristics of P-type semiconductor are opposite to that of N-type semiconductor. The determinant of whether a particular semiconductor body contains excess electrons or excess electron vacancies lies primarily in the amount and type of significant impurities or "activators" present in the semiconductor. Some activators, called "donors," such as antimony, phosphorus and arsenic, function to furnish additional free electrons to the semiconductor so as to produce an electronic excess N-type semiconductor. Other activators, called "acceptors," such as aluminum, gallium, and indium, function to absorb electrons to create P-type semiconductor with an excess of "positive holes." Only minute traces of these activators, less than 1 part per million, are sufficient to produce marked electrical characteristics of one type or the other.

It has been known for some time that if a semiconductor body is produced having a P-type zone adjoining an N-type zone to form a thin intrinsic semiconductor junction layer or space charge barrier, the resulting "P–N junction unit" possesses remarkable rectifying, thermoelectric, and photoelectric properties. A current may be passed easily in only one direction through such units, and a potential difference may be generated between the P-type and N-type zones by concentrating light or heat upon the junction.

More recently, it has been found that a semiconductor body having a zone of one conductivity type adjoining two zones of opposite conductivity type to form two P–N junctions can be used in a three-terminal device known as a "transistor" to provide current, voltage, and power amplification. These amplifying semiconductor bodies have become known as P–N–P or N–P–N junction units in accord with the distribution of their P-type and N-type zones. The three-terminal semiconductor devices utilizing such double junction units have become known as "large area" or "P–N junction type" transistors, in order to distinguish them from transistors in which two point contacting electrodes serve the purpose of such P–N junctions.

Many different methods have been suggested for predictably forming the P–N junction within a semiconductor body. The electrical characteristics of the P–N junction units formed by these various methods differ to a great extent but may be roughly classified into two general types.

In one type of P–N junction unit, hereinafter referred to as the "high voltage type," a high-resistivity P-type zone lightly impregnated with an acceptor activator adjoins a high-resistivity N-type zone lightly impregnated with a donor activator to produce a P–N junction barrier with a relatively gradual impurity gradient across the junction. This produces a high impedance space charge barrier which can withstand a remarkably high voltage, often in excess of 1,000 volts applied in the difficult-flow direction across the resulting unit. Such high voltage type P–N junction units result, for example, when the junction is formed during a crystal growth of the semiconductor from a suitable melt. One such high voltage type of P–N junction unit, together with a crystal growth rate variation method of making it, forms a portion of the subject matter of my U. S. patent application, Serial No. 304,203 filed August 13, 1952, and assigned to the assignee of the present invention.

In the second type of P–N junction unit, hereinafter referred to as the "high current type," a low-resistivity, heavily acceptor-activator impregnated P-type zone and a low-resistivity, heavily donor-activator impregnated N-type zone adjoin opposite sides of a central high resistivity N-type, P-type, or intrinsic zone. This type of P–N junction unit rarely withstands more than 400 volts in the reverse or difficult-flow direction, but has a much larger current handling capacity in the forward or easy-flow direction than the high-voltage type. One such high current type of P–N junction unit, together with an activator electrode diffusion method of making it, forms a portion of the subject matter of my U. S. patent application, Serial No. 187,478 filed September 29, 1950, and assigned to the same assignee as the present invention.

Accordingly, an important object of my invention is to provide a P–N junction unit which has both the high reverse voltage characteristic of prior high voltage type units and the high forward current characteristic of prior high current type units with the result that an unusually efficient high power rectifier or transistor may be produced from my new P–N junction units.

Another object of my invention is to provide a new method for producing high power P–N junction semiconductor units.

A further object of the invention is to provide an improved high power semiconductor rectifier.

A still further object is to provide an improved high power semiconductor transistor.

In general, in accord with the invention, a P–N junction is formed in a semiconductor crystal during the solidification and growth of the crystal from a semiconductor melt containing traces of donor and acceptor activators. The parameters of melt impregnation and crystal growth are controlled so that the resulting grown crystal contains a high resistivity P-type zone adjoining a high resistivity N-type zone to form an intermediate high impedance P–N junction barrier with a gradual impurity gradient across the barrier. A donor activator is then fused to and diffused within a surface adjacent region of the N-type zone of the grown crystal, and an acceptor activator is similarly fused to and diffused within a surface adjacent region of the P-type zone of the grown crystal. The two activator impregnated surface adjacent regions of the crystal are preferably less than 0.040 inch apart. The donor activator heavily impregnates the surface adjacent region of the N-type zone to produce a low resistivity heavily N-type region which functions as a reservoir of negative conduction carriers to increase the forward conduction characteristics of the resulting unit. The acceptor activator similarly heavily impregnates the surface adjacent region of the P-type zone to produce a low resistivity heavily P-type region functioning as a reservoir of positive conduction carriers to further augment the forward conduction characteristics of the resulting unit. The donor and acceptor activators preferably also constitute electrodes to which connection can be made when the resulting P–N junction unit is used as a rectifier or transistor.

Figure 2:
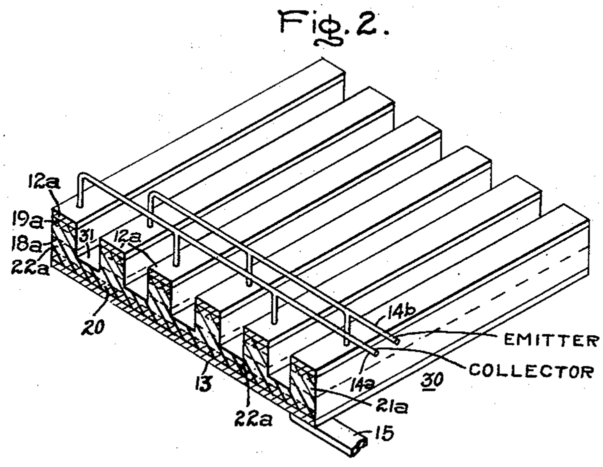
Figure 3:
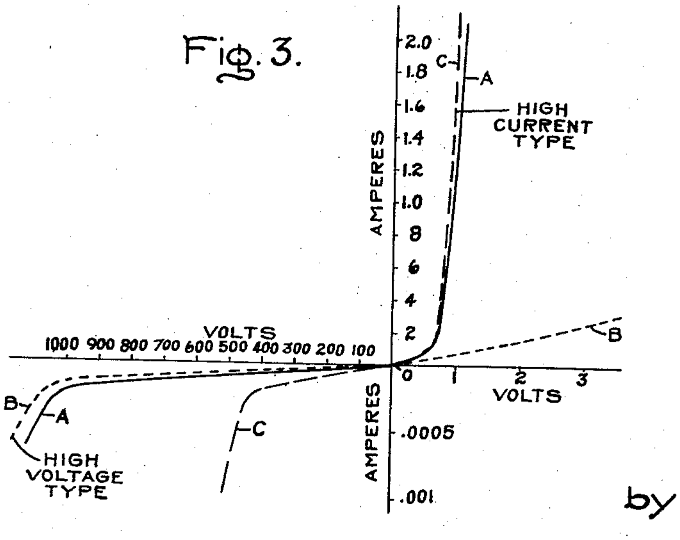

The novel features which are believed characteristic of the invention are set forth in the appended claims. The invention itself, however, together with further objects and advantages thereof, may best be understood by referring to the following description taken in connection with the accompanying drawing in which Fig. 1 is a sectioned perspective view of a rectifier embodying the invention, Fig. 2 is a sectioned perspective view of a transistor embodying the invention, and Fig. 3 is a group of voltage vs. current curves illustrating the improvement in electrical characteristics produced by the rectifier of Fig. 1 over conventional rectifiers.

Referring to Fig. 1, the invention is shown as embodied in a rectifier 10 comprising a semiconductor crystal 11, electrodes 12 and 13, and conductors 14 and 15 respectively connected to electrodes 12 and 13. Semiconductor crystal 11, preferably germanium, has a thickness less than 0.040 inch and has a P-type zone 16 and an N-type zone 17 which adjoin each other to form a P–N junction layer or barrier 18. Electrode 12 comprises an acceptor activator such as indium, aluminum, or gallium and is fused to and diffused within a surface adjacent region 19 of P-type zone 16. Region 19 is thus heavily impregnated with acceptor activator electrode 12 so as to have a resistivity less than .01 ohm centimeter and preferably in the neighborhood of .001 ohm centimeter. The remainder internal region 21 of P-type zone 16 consists of substantially pure germanium with only a trace of an acceptor impurity so as to have a resistivity above .1 ohm centimeter and preferably in the neighborhood of 5 ohm centimeters.

Electrode 13 comprises a donor activator such as antimony or arsenic and is fused to and diffused within a surface adjacent region 20 of N-type zone 17. Surface adjacent region 20 is thus heavily impregnated with the donor activator electron 13 to have great electronic excess and a resistivity below .01 ohm centimeter; while internal region 22 of N-type zone 17 consists of substantially pure germanium having only a trace of donor activator to have a resistivity above .1 ohm centimeter. P–N junction 18 is a high impedance barrier with a gradual impurity gradient from slightly impregnated P-type germanium to slightly impregnated N-type germanium across the barrier and capable of withstanding without breakdown a high potential drop, for example, above 500 volts, across the barrier. The details of forming crystal grown P–N junction 18 and heavily activated surface adjacent regions 19 and 20 will be described hereinafter.

Crystal 11 is preferably somewhat less than 0.040 inch thick in order to insure an optimum forward current characteristic. The preferred thickness of crystal 11 can also be described in terms of a distance less than 0.030 inch from each region 19 or 20 to the P–N junction 18. The overall thickness of 0.040 inch corresponds to about one "diffusion length" in a germanium semiconductor carrying a high current; the diffusion length being defined as the average distance a minority-type conduction carrier moves through the semiconductor before recombining with an oppositely charged carrier. More specifically, the diffusion length equals the square root of the lifetime of the minority carrier times its diffusion constant. For germanium of high purity, the average lifetime is from about 50 to 100 microseconds, and the diffusion constant for positive holes is about 44 $cms.^2/sec.$ while the diffusion constant for electrons is about 90 $cms.^2/sec.$ When rectifier 10 is connected in an alternating current circuit, current flows easily through the rectifier when electrode 12 is at a positive potential relative to electrode 13 and current is effectively blocked when electrode 12 is negative with respect to electrode 13. During the positive or easy-flow alternation, the donor impregnated region 20 acts as a reservoir of electrons from which electrons are easily furnished into the conduction process to be swept toward the positive electrode 12. The acceptor-impregnated surface region 19 likewise simultaneously serves as a reservoir of "positive holes" which are easily moved into the conduction process and swept toward the negative electrode 13. Consequently, a very small potential difference between electrodes 12 and 13 is sufficient to produce a substantial current in the forward direction through rectifier 10. A rectifier such as rectifier 10 having a semiconductor crystal 11 0.030 inch thick and a barrier area of 1 square centimeter has been found to pass a current of 500 amperes under the influence of 1 volt potential difference applied in the forward direction between electrodes 12 and 13. During the negative or difficult-flow alternation current is blocked by barrier 18, and the efficacy of the rectification depends upon the quality of this barrier. Crystal grown barriers such as included in rectifier 10, however, have been found to withstand voltages above 500 volts without appreciable leakage current and without breakdown. A typical voltage versus current characteristic curve of a rectifier 10 in accord with the invention is shown in Fig. 3 as curve A together with a typical curve B of the conventional high voltage type and a typical curve C of the conventional high current type. These curves are for a unit having a P–N junction area of 1 square millimeter and illustrate that rectifier 10 has the advantages of both types without the disadvantages of either. For high power applications, rectifier 10 may be air or liquid cooled to prevent excessive rise in temperature.

In one method of making rectifier 10, a melt is prepared consisting of a semiconductor, preferably germanium, a trace of a donor impurity for the semiconductor and a trace of an acceptor impurity for the semiconductor. The word "trace" is herein employed to connote the presence of the designated impurities in amounts less than .05% by weight of the semiconductor material involved. The impurity or "activator" traces are included in the melt in proper proportion to induce opposite type conduction carriers having equal electrical effect and thus to produce intrinsic type semiconductor in a crystal grown from a melt at a predetermined growth rate. Moreover, the selected donor and acceptor impurities are those having different rates of segregation constant variation over a range of crystal growth variation encompassing the above-mentioned predetermined growth rate at which intrinsic semiconductor is formed. A monocrystalline ingot is then grown from this melt at growth rates successively varying above and below this intrinsic semiconductor forming growth rate. At a growth rate above the intrinsic semiconductor forming growth rate, one impurity element, such as the donor, is assimilated in excess by the growing ingot to produce N-type conductivity semiconductor, while at a growth rate below the intrinsic semiconductor forming growth rate the other impurity element, such as the acceptor, is assimilated in excess to produce P-type conductivity semiconductor.

The impurity gradient bordering and across the semiconductor P–N junction region 18 may be easily and accurately controlled by adjusting the incremental growth rate variation as it passes through the junction-forming growth rate. The amount of conduction carriers in each conductivity type region can be easily and accurately controlled by the absolute amounts of donor and acceptor activator traces added to the melt, and the ratio of negative to positive conduction carriers can be controlled by the ratio of donor and acceptor impurities in the melt which, in turn, determines the growth rate at which P–N junctions are formed.

The crystal growth rate is, of course, dependent upon the temperature gradient across the liquid to solid interface and is conveniently and preferably controlled by merely raising or lowering the temperature of the melt. The crystal growth rate may be varied in this manner from 0 to about 20 inches per hour. For example, the melt from which crystal 11 is grown may consist of germanium, antimony, and gallium in which the weight ratio of antimony to gallium is from 20 to 65 parts antimony to 1 part gallium, and the total antimony-gallium content in the melt is from 1 to 100 milligrams antimony-gallium for each 100 grams germanium. A monocrystalline germanium ingot is then grown from the melt by seed crystal withdrawal, and the temperature of the melt is varied while the ingot is growing to vary the growth rate from a rate above 5 inches per hour to a rate less than 1 inch per hour with a rate of change of growth velocity of the order of 0.5 inch per minute per minute. At a growth rate above 5 inches per hour, the antimony is ordinarily assimilated in excess by the growing ingot to form N-type germanium while at a growth rate below 1 inch per hour the gallium is assimilated in excess to produce P-type germanium. Somewhere during the course of growth rate variation, the assimilated donor and acceptor activators will be in electrical balance and produce the P–N junction 18. Further details of this method for producing P–N junctions by growth rate variation of a growing semiconductor crystal are disclosed and claimed in my above-mentioned patent application, Serial No. 304,203.

Another method for producing P–N junction 18 is to grow crystal 11 from a substantially pure semiconductor melt at a very slow constant rate of growth, usually less than 1 inch per hour, and successively to add to the melt small traces of donor and acceptor activators, thereby to convert the growing ingot from one type semiconductor to the other. For example, a germanium monocrystalline ingot is grown from a semiconductor melt consisting of 100 grams of substantially pure germanium initially having a resistivity above 20 ohm centimeters and to which 10 micrograms of pure gallium have been added in order to produce P-type germanium in the growing ingot. After a portion of the ingot has been grown, 1 milligram of pure antimony is added to the melt to convert the growing P-type germanium to N-type germanium. The amount of donor and acceptor activator traces included is, of course, so small that the resistivity of the resulting germanium ingot remains considerably above 1 ohm centimeter.

A P–N junction semiconductor crystal 11 is then extracted from the grown ingot in a manner such that the crystal grown junction 18 bisects the extracted crystal and lies in a plane parallel to the opposite major surfaces thereof. Crystal 11 may conveniently have a thickness in the neighborhood of 0.030 inch and length and width dimensions of the order of 0.5 inch. After the opposite major surfaces of crystal 11 have been cleaned and preferably etched, electrodes 12 and 13 are applied thereto in any suitable manner and fused to and fused or diffused within the surface adjacent regions 18 and 19 thereof by a suitable heat treatment. Acceptor electrode 12 may conveniently consist of an acceptor activator such as indium fused to and diffused within surface region 18 by heating for a few minutes at 400° C. Alternatively, electrode 12 may be an alloy containing an acceptor activator such as an alloy of silver and indium; or an alloy of acceptor activators such as an alloy of gallium and indium.

Donor electrode 13 may conveniently consist of a donor activator such as antimony fused to and within surface region 19 by heating for a few minutes at a temperature in the neighborhood of 650° C. Alternatively, electrode 13 may be an alloy containing the donor activator such as, for example, an alloy of tin containing from 5 to 20% antimony or an alloy of tin containing from 1 to 10% of arsenic. If a tin-donor activator alloy is employed, the temperature required for fusion need only be in the neighborhood of 400° C. Conductors 14 and 15 are then soldered or otherwise conductively attached to electrodes 12 and 13.

Referring now to Fig. 2, there is shown a transistor 30 embodying the invention. Transistor 30 is made the same as rectifier 10 with the exception that after the rectifier 10 has been made, a plurality of parallel grooves 31 are ground or otherwise formed along one major dimension of the rectifier and extending in the thickness dimension through P-type zone 16 and beyond P–N junction 18 into a portion of N-type zone 17 as illustrated. A plurality of separate P-type zones 16a, and a plurality of P–N junctions 18a are thus formed in the crystal element. Acceptor electrode 12 is likewise separated into a number of acceptor electrodes 12a. Alternate electrodes 12a are then interconnected by suitable conductors 14a and 14b which constitute the emitter and collector electrodes respectively of the resulting transistor. The arrangement of alternate interleaved emitter and collector electrodes is disclosed and claimed in my copending application, Serial No. 328,436, filed December 29, 1952, and assigned to the same assignee as the present invention. Conductor 15 connected to donor electrode 13 constitutes the base or return electrode for transistor 30. Although Fig. 2 illustrates a P–N–P junction transistor, it will be apparent that an N–P–N transistor may be made in the same way by forming parallel grooves which extend through N-type zone 17 into P-type zone 16 rather than through P-type zone into N-type zone as illustrated. The heavily activated surface-adjacent regions 19a and 20 function to increase the current handling capacity of both the emitter and collector electrodes 14a and 14b when they are biased at or driven to a voltage producing a current in the easy-flow direction relative to base electrode 13. Crystal grown barriers 18a increase the back voltage characteristic of the resulting transistor 30 when the emitter or collector electrodes 14a or 14b are biased at or driven to a voltage producing a current in the difficult-flow direction relative to base electrode 15. Consequently, the maximum inverse voltage rating and the maximum current handling capacity of power transistor 30 are both optimized with the result that transistor 30 may be given a much higher power rating than conventional type transistors.

Although I have described above particular embodiments of the invention, many modifications may be made. I intend, therefore, by the appended claims to cover all such modifications as fall within the true spirit and scope of the invention.

What I claim as new and desire to secure by Letters Patent of the United States is:

1. A current control device comprising a semiconductor crystal having a P-type zone and an adjoining N-type zone forming an intermediate P–N junction, said P-type zone having a slightly P-type region bordering said junction and a more strongly P-type surface adjacent region remote from said junction, said N-type zone having a slightly N-type region bordering said junction and a more strongly N-type surface adjacent region remote from said junction, an acceptor activator electrode fused to said P-type surface adjacent region of said crystal, and a donor activator electrode fused to said N-type surface adjacent region of said crystal.

2. A semiconductor P–N junction unit comprising a semiconductor crystal having a P-type zone and an N-type zone contiguous with said P-type zone and forming a P–N junction therewith, said P-type zone having bordering said junction a first region impregnated with only a trace of an acceptor activator and having adjacent its surface a second region heavily impregnated with an acceptor activator, said N-type zone having bordering said junction a first region impregnated with only a trace of a donor activator and having adjacent its surface a second region heavily impregnated with a donor activator.

3. A current control device comprising a semiconductor crystal having a thickness less than 0.040 inch and having along its thickness dimension, a first zone of slight positive conductivity and a second zone of slight negative conductivity forming a P–N junction with said first zone, a first electrode comprising an acceptor activator fused to and within a surface region of said first zone to impregnate heavily said surface region of said first zone with positive conduction carriers, and a second electrode comprising a donor activator fused to and within a surface region of said second zone to impregnate heavily said surface region of said second zone with negative conduction carriers.

4. A current control device comprising a germanium monocrystal having a P-type zone and an N-type zone adjoining said P-type zone to form a P–N junction therewith, said P-type zone having bordering said junction a first region lightly impregnated with acceptor activator to have a resistivity above 0.1 ohm centimeter and having a second region adjacent its surface heavily impregnated with acceptor activator to have a resistivity less than 0.01 ohm centimeter, said N-type zone having bordering said junction a first region lightly impregnated with donor activator to have a resistivity above 0.1 ohm centimeter and having a second region adjacent its surface heavily impregnated with donor activator to have a resistivity less than 0.01 ohm centimeter, a first electrode connected with the second region of said P-type zone, and a second electrode connected with the second region of said N-type zone.

5. The current control device of claim 4 in which the first electrode comprises an acceptor activator and makes fused connection with the second region of said P-type zone, and the second electrode comprises a donor activator and makes fused connection with the second region of said N-type zone.

6. A current control device comprising a semiconductor monocrystal having a P-type zone, an adjoining N-type zone, and a P–N junction barrier at the joinder of said zones, said zones and junction being formed during solidification of said crystal from a semi-conductor melt, an acceptor activator fused to and diffused within a region of said P-type zone remote from said junction, and a donor activator fused to and diffused within a region of said N-type zone remote from said junction.

7. The current control device of claim 6 in which the semiconductor monocrystal comprises germanium, the acceptor activator comprises indium and constitutes one electrode for said device, and the donor activator comprises antimony and constitutes another electrode for said device.

8. A high power rectifier comprising a germanium monocrystal having a thickness less than 0.040 inch and having along its thickness dimension a P-type zone, an adjoining N-type zone and a P–N junction barrier at the joinder of said zones, said zones each having a resistivity above 0.1 ohm centimeter and having a trace of a conductivity type determining activator assimilated during solidification of said crystal from a germanium melt containing the activators, a first electrode comprising an acceptor activator fused to and diffused within a region of said P-type zone remote from said junction, and a second electrode comprising a donor activator fused to and diffused within a region of said N-type zone remote from said junction.

9. The high power rectifier of claim 8 in which the acceptor activator electrode comprises indium and the donor activator electrode comprises antimony.

10. A high power transistor comprising a semiconductor crystal having a zone of one conductivity type separating two zones of opposite conductivity type and forming separate P–N junction barriers therewith, said zones having, bordering their respective P–N junctions, regions lightly impregnated with conduction carriers of their respective conductivity types and having, adjacent their surfaces and extending within less than 0.030 inch of their junctions, regions heavily impregnated with conduction carriers of their respective conductivity types, and separate electrodes fused to the heavily impregnated surface adjacent regions of said zones.

11. The high power transistor of claim 10 in which the separate electrodes comprise activators of the same conductivity type as the regions to which they are fused.

12. A high power transistor comprising a germanium monocrystal having an N-type zone adjoining two spaced P-type zones to form two separate P–N junction barriers, said zones each having a resistivity above 0.1 ohm centimeter and having a trace of a conductivity-determining activator assimilated during solidification of said crystal from a germanium melt containing the activators, a first electrode comprising a donor activator fused to and within a region of said N-type zone extending less than 0.030 inch from said junction barriers, and second and third electrodes comprising acceptor activators fused to and within regions of said P-type zones extending less than 0.030 inch from said barriers.

13. A high power transistor comprising a germanium monocrystal having a P-type zone adjoining two spaced N-type zones to form two separate P–N junction barriers, said zones each having a resistivity above 0.1 ohm centimeter and having a trace of a conductivity-determining activator assimilated during solidification of said crystal from a germanium melt containing the activators, a first electrode comprising an acceptor activator fused to and within a region of said P-type zone remote from said junction barriers, and second and third electrodes comprising donor activators fused to and within regions of said N-type zones remote from said barriers.

14. A high power transistor comprising a germanium monocrystal having an N-type zone and a plurality of P-type zones adjoining said N-type zones and forming separate P–N junctions therewith at spaced areas along one dimension of said N-type zone, said zones having regions bordering each of said junctions lightly impregnated with conduction carrier activators to have resistivities above 0.1 ohm centimeter, a donor activator electrode fused to and within a surface adjacent region of said N-type zone, a plurality of acceptor activator electrodes each fused to and within a surface adjacent region of a respective one of said P-type zones, and conductors interconnecting the acceptor electrodes fused to alternate P-type zones.

15. A high power transistor comprising a germanium monocrystal having a P-type zone and a plurality of N-type zones adjoining said P-type zones and forming separate P–N junctions therewith at spaced areas along one dimension of said P-type zone, said zones having regions bordering each of said junctions lightly impregnated with conduction carrier activators to have resistivities above 0.1 ohm centimeter, an acceptor activator electrode fused to and within a surface adjacent region of said P-type zone, a plurality of donor activator electrodes each fused to and within a surface adjacent region of a respective one of said N-type zones, and conductors interconnecting the donor electrodes fused to alternate N-type zones.

References Cited in the file of this patent

UNITED STATES PATENTS

| Number | Name | Date |
|---|---|---|
| 2,402,662 | Ohl | June 25, 1946 |
| 2,603,692 | Scaff | July 15, 1952 |
| 2,603,693 | Kircher | July 15, 1952 |
| 2,623,105 | Shockley et al. | Dec. 23, 1952 |